United States Patent
Habu et al.

(10) Patent No.: US 9,844,147 B2
(45) Date of Patent: Dec. 12, 2017

(54) METHOD FOR PRODUCING SOFT MAGNETIC FILM LAMINATE CIRCUIT BOARD

(71) Applicant: NITTO DENKO CORPORATION, Osaka (JP)

(72) Inventors: Takashi Habu, Osaka (JP); Hirofumi Ebe, Osaka (JP)

(73) Assignee: NITTO DENKO CORPORATION, Osaka (JP)

(*) Notice: Subject to any disclaimer, the term of this patent is extended or adjusted under 35 U.S.C. 154(b) by 69 days.

(21) Appl. No.: 14/893,834

(22) PCT Filed: Apr. 14, 2014

(86) PCT No.: PCT/JP2014/060601
§ 371 (c)(1),
(2) Date: Nov. 24, 2015

(87) PCT Pub. No.: WO2014/192445
PCT Pub. Date: Dec. 4, 2014

(65) Prior Publication Data
US 2016/0105969 A1    Apr. 14, 2016

(30) Foreign Application Priority Data
May 27, 2013  (JP) ................. 2013-111104

(51) Int. Cl.
*H05K 3/00* (2006.01)
*H05K 1/16* (2006.01)

(52) U.S. Cl.
CPC ........... *H05K 3/0058* (2013.01); *H05K 1/165* (2013.01); *H05K 2201/0116* (2013.01);
(Continued)

(58) Field of Classification Search
CPC ................. H05K 3/0058; H05K 3/0064
(Continued)

(56) References Cited

U.S. PATENT DOCUMENTS 4,180,608 A * 12/1979 Del ............... H05K 3/4673
156/235
5,444,190 A    8/1995 Yamanami et al.
(Continued)

FOREIGN PATENT DOCUMENTS

JP    H5-158606 A    6/1993
JP    2002-299814 A  10/2002
(Continued)

OTHER PUBLICATIONS

International Search Report Issued in PCT/JP2014/060601 dated Jul. 15, 2014.
(Continued)

*Primary Examiner* — Scott W Dodds
(74) *Attorney, Agent, or Firm* — Edwards Neils LLC; Jean C. Edwards, Esq.

(57) ABSTRACT

A method for producing a soft magnetic film laminate circuit board having a soft magnetic film laminated on at least one side of a circuit board includes the steps of bringing a soft magnetic thermosetting film containing soft magnetic particles, having a porosity of 15% or more and 60% or less, and in a semi-cured state into contact with the one side of the circuit board and bringing the soft magnetic thermosetting film into a cured state by vacuum hot pressing.

2 Claims, 1 Drawing Sheet

(52) U.S. Cl.
   CPC .............. *H05K 2201/0245* (2013.01); *H05K 2201/086* (2013.01); *H05K 2203/068* (2013.01); *H05K 2203/085* (2013.01)

(58) Field of Classification Search
   USPC .................................. 156/307.1, 307.7, 286
   See application file for complete search history.

(56) References Cited

U.S. PATENT DOCUMENTS

| | | | |
|---|---|---|---|
| 2002/0121334 A1 | 9/2002 | Ikeda et al. | |
| 2009/0110587 A1* | 4/2009 | Aramaki | B22F 1/0055 419/10 |

FOREIGN PATENT DOCUMENTS

| | | |
|---|---|---|
| JP | 2006-032929 A | 2/2006 |
| JP | 2006-039947 A | 2/2006 |
| JP | 2011-003583 A | 1/2011 |
| JP | 2013-026324 A | 2/2013 |
| JP | 2014-057041 A | 3/2014 |

OTHER PUBLICATIONS

Written Opinion Issued in PCT/JP2014/060601 dated Jul. 15, 2014.
International Preliminary Report on Patentability issued by WIPO dated Dec. 1, 2015 in connection with International Patent Application No. PCT/JP2014/060601.
Extended European Search Report issued by the European Patent Office dated Apr. 13, 2017, in connection with European Patent Application No. 14803738.5.
Timpe et al., "Void Reduction during Low Pressure Lamination of Electronic Assemblies" International Symposium on Microelectronics (IMAPS 2006) Proceedings 2006, available on URL: https://www.rogerscorp.com/documents/3365/ems/arlon/Void-Reduction-during-Low-Pressure-Lamination-of-Electronic-Assemblies.pdf, pp. 1401-1406.

* cited by examiner

METHOD FOR PRODUCING SOFT MAGNETIC FILM LAMINATE CIRCUIT BOARD

CROSS-REFERENCE TO RELATED APPLICATIONS

The present application is a 35 U.S.C. 371 National Stage Entry of PCT/JP2014/060601, filed Apr. 14, 2014, which claims priority from Japanese Patent Application No. 2013-111104, filed on May 27, 2013, the contents of all of which are herein incorporated by reference in their entirety.

TECHNICAL FIELD

The present invention relates to a method for producing a soft magnetic film laminate circuit board.

BACKGROUND ART

A position detection device having a pen-type position indicator for detecting a position by moving the pen on a position detection plane is called a digitizer, and is widely spread as an input device for computers. The position detection device includes a position detection flat plate, and a circuit board (sensor board) disposed therebelow and having loop coils formed on the surface of the board. Then, the position of the position indicator is detected by using electromagnetic induction generated by the position indicator and the loop coils.

As referred to in Patent Document 1, for example, a shield plate made of nickel chromium alloy is attached to a face opposite to the face of the position detection plane of the sensor board in a position detection device via an adhesive layer for efficient communication by controlling the magnetic flux generated at the time of electromagnetic induction.

Meanwhile, Patent Document 2 has proposed, for example, a composite magnetic sheet having flexibility formed by blending a soft magnetic powder shaped flat and a binder as a composite magnetic sheet disposed on the back face of an antenna in the data carrier and the reader-writer in an automatic recognition device transmitting and receiving data by electromagnetic waves.

CITATION LIST

Patent Document

Patent Document 1: Japanese Unexamined Patent Publication No. H5-158606
Patent Document 2: Japanese Unexamined Patent Publication No. 2006-39947

SUMMARY OF THE INVENTION

Problem to be Solved by the Invention

In the position detection device described in Patent Document 1, the shield plate is required to be attached to the sensor board via the adhesive layer. However, in view of film thinning and handleability, the circuit board and the shield plate are required to be laminated without the adhesive layer.

Meanwhile, the composite magnetic sheet described in Patent Document 2 can be attached to the circuit board without through the adhesive layer.

However, the composite magnetic sheet described in Patent Document 2 has weak adhesiveness to the circuit board and a peeling easily occurs.

In the circuit board to which the composite magnetic sheet is attached, a reflowing process along with the subsequent mounting of an electronic component is generally performed. However, by high temperature in the reflowing process, there may be a case where a void occurs and expands on the interface between the circuit board and the composite magnetic sheet; unevenness occurs on a surface of a soft magnetic film; and the soft magnetic film is peeled from the circuit board. As a result, magnetic properties of the soft magnetic film may not be sufficiently exhibited and the appearance thereof becomes poor.

An object of the present invention is to provide a method for producing a soft magnetic film laminate circuit board having excellent adhesiveness of the soft magnetic film to the circuit board and having excellent reflow resistance.

Means for Solving the Problem

To achieve the above-described object, a method for producing a soft magnetic film laminate circuit board of the present invention having a soft magnetic film laminated on at least one side of a circuit board includes the steps of bringing a soft magnetic thermosetting film containing soft magnetic particles, having a porosity of 15% or more and 60% or less, and in a semi-cured state into contact with the one side of the circuit board and bringing the soft magnetic thermosetting film into a cured state by vacuum hot pressing.

In the method for producing a soft magnetic film laminate circuit board of the present invention, it is preferable that the specific gravity of the soft magnetic thermosetting film in a cured state relative to that of the soft magnetic thermosetting film in a semi-cured state is 1.5 times or more.

Effect of the Invention

In the method for producing a soft magnetic film laminate circuit board of the present invention, the soft magnetic film can surely adhere to the circuit board without using the adhesive layer, and the soft magnetic film laminate circuit board having excellent reflow resistance can be produced.

DESCRIPTION OF EMBODIMENTS

A method for producing a soft magnetic film laminate circuit board of the present invention includes the steps of bringing a soft magnetic thermosetting film containing soft magnetic particles, having a porosity of 15% or more and 60% or less, and in a semi-cured state into contact with one side of a circuit board and bringing the soft magnetic thermosetting film into a cured state by vacuum hot pressing. The producing method is described with reference to FIGS. 1A to 1C.

Figure 1A:
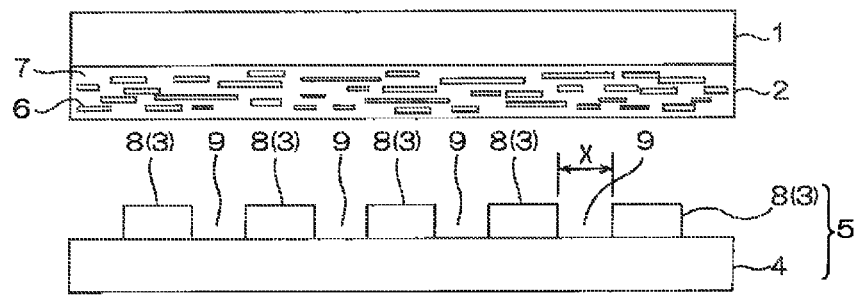
FIG. 1A shows a process drawing for illustrating one embodiment of a method for producing a soft magnetic film laminate circuit board of the present invention, illustrating a step of preparing a soft magnetic thermosetting film and a circuit board.

In this method, first, as shown in FIG. 1A, a soft magnetic thermosetting film 2 and a circuit board 5 are prepared. To be more specific, the soft magnetic thermosetting film 2 on which a separator 1 is laminated and the circuit board 5 in which a wire pattern 3 is formed on a surface of a substrate 4 are prepared and then, the soft magnetic thermosetting film 2 and the circuit board 5 are disposed to face each other in spaced-apart relation in a thickness direction.

The soft magnetic thermosetting film 2 is, for example, formed from a soft magnetic resin composition containing soft magnetic particles 6 and a thermosetting resin component 7.

Examples of the soft magnetic materials of the soft magnetic particles 6 include magnetic stainless steel (Fe—Cr—Al—Si alloy), Sendust (Fe—Si—Al alloy), permalloy (Fe—Ni alloy), silicon copper (Fe—Cu—Si alloy), Fe—Si alloy, Fe—Si—B (—Cu—Nb) alloy, Fe—Si—Cr—Ni alloy, Fe—Si—Cr alloy, Fe—Si—Al—Ni—Cr alloy, and ferrite.

Among these, preferably, Sendust (Fe—Si—Al alloy) is used. More preferably, a Fe—Si—Al alloy having a Si content of 9 to 15 mass % is used. In this manner, magnetic permeability of the soft magnetic thermosetting film 2 can be made excellent.

The soft magnetic particles 6 are preferably shaped flat (plate). The aspect ratio is, for example, 8 or more, preferably 15 or more, and for example, 80 or less, preferably 65 or less. The aspect ratio is calculated as an aspect ratio dividing the 50% particle size (D50) by an average thickness of the soft magnetic particles.

The soft magnetic particles 6 have an average particle size (average length) of, for example, 3.5 μm or more, preferably 10 μm or more, and for example, 100 μm or less. The average thickness is, for example, 0.3 μm or more, preferably 0.5 μm or more, and for example, 3 μm or less, preferably 2.5 μm or less. By adjusting the aspect ratio, the average particle size, and the average thickness of the soft magnetic particles 6, demagnetization effects of the soft magnetic particles 6 can be reduced, and as a result, magnetic permeability of the soft magnetic particles 6 can be increased. To equalize the size of the soft magnetic particles 6, as necessary, those soft magnetic particles 6 classified with, for example, a sieve can be used.

The soft magnetic particles 6 have a specific gravity of, for example, 5.0 or more, preferably 6.0 or more, and for example, 9.0 or less, preferably 8.0 or less.

The soft magnetic particles 6 content (proportion in the solid component excluding a solvent (that is, the soft magnetic particles and a thermosetting resin component; and a thermosetting catalyst, polyether phosphate ester, and an additional additive contained as necessary)) in the soft magnetic resin composition is, for example, 50% by volume or more, preferably 60% by volume or more, and for example, 95% by volume or less, preferably 90% by volume or less and is also, for example, 80 mass % or more, preferably 85 mass % or more, and for example, 98 mass % or less, preferably 95 mass % or less. By setting the soft magnetic particles 6 content in the range of the above-described upper limit or less, the soft magnetic resin composition having excellent film-forming properties can be achieved. Meanwhile, by setting the soft magnetic particles 6 content in the range of the above-described lower limit or more, the soft magnetic thermosetting film 2 having excellent magnetic properties can be achieved.

The thermosetting resin component 7 contains a thermosetting resin.

Examples of the thermosetting resin include epoxy resin, phenol resin, amino resin, unsaturated polyester resin, polyurethane resin, silicone resin, and thermosetting polyimide resin. Preferably, epoxy resin and phenol resin are used, or more preferably, epoxy resin and phenol resin are used in combination.

The epoxy resin that is used as an adhesive composition can be, for example, used. Examples thereof include bifunctional epoxy resins and multifunctional epoxy resins such as bisphenol epoxy resin (particularly, bisphenol A epoxy resin, bisphenol F epoxy resin, bisphenol S epoxy resin, brominated bisphenol A epoxy resin, hydrogenated bisphenol A epoxy resin, bisphenol AF epoxy resin, etc.), phenol epoxy resin (particularly, phenol novolak epoxy resin, orthocresol novolak epoxy resin, etc.), biphenyl epoxy resin, naphthalene epoxy resin, fluorine epoxy resin, trishydroxyphenylmethane epoxy resin, and tetraphenylolethane epoxy resin. Furthermore, examples thereof also include hydantoin epoxy resin, trisglycidylisocyanurate epoxy resin, and glycidylamine epoxy resin. Of these epoxy resins, preferably, bisphenol epoxy resin is used, or more preferably, bisphenol A epoxy resin is used.

These can be used singly, or can be used in combination of two or more.

Containing such epoxy resins allows for excellent reactivity with the phenol resin, and as a result, the soft magnetic film having excellent reflow resistance can be achieved.

The epoxy resin has a specific gravity of, for example, 1.0 or more and, for example, 1.5 or less.

The phenol resin is a curing agent for epoxy resin, and for example, novolak-type phenol resins such as phenol novolak resin, phenol aralkyl resin, cresol novolak resin, tert-butyl phenol novolak resin, and nonylphenol novolak resin; resoltype phenol resin; and polyoxystyrene such as polyparaoxystyrene are used. These can be used singly, or can be used in combination of two or more. Of these phenol resins, preferably novolak-type resin is used, more preferably phenol novolak resin and phenol aralkyl resin are used, or further more preferably phenol aralkyl resin is used. Containing these phenol resins allows for improvement in connection reliability of a soft magnetic film laminate circuit board 11.

The phenol resin has a specific gravity of, for example, 1.0 or more and for example, 1.5 or less.

When the hydroxyl equivalent of the phenol resin relative to 100 g/eq of the epoxy equivalent of the epoxy resin is 1 g/eq or more and less than 100 g/eq, the epoxy resin content relative to 100 parts by mass of the thermosetting resin component is, for example, 15 parts by 1mass or more, preferably 35 parts by mass or more, and for example, 70 parts by mass or less, and the phenol resin content relative to 100 parts by mass of the thermosetting resin component is, for example, 5 parts by mass or more, preferably 15 parts by mass or more, and for example, 30 parts by mass or less.

When the hydroxyl equivalent of the phenol resin relative to 100 g/eq of the epoxy equivalent of the epoxy resin is 100 g/eq or more and less than 200 g/eq, the epoxy resin content relative to 100 parts by mass of the thermosetting resin component is, for example, 10 parts by mass or more, preferably 25 parts by mass or more, and for example, 50 parts by mass or less, and the phenol resin content relative to 100 parts by mass of the thermosetting resin component is, for example, 10 parts by mass or more, preferably 25 parts by mass or more, and for example, 50 parts by mass or less.

When the hydroxyl equivalent of the phenol resin relative to 100 g/eq of the epoxy equivalent of the epoxy resin is 200 g/eq or more and 1000 g/eq or less, the epoxy resin content relative to 100 parts by mass of the thermosetting resin component is, for example, 5 parts by mass or more, preferably 15 parts by mass or more, and for example, 30 parts by mass or less, and the phenol resin content relative to 100 parts by mass of the thermosetting resin component is, for example, 15 parts by mass or more, preferably 35 parts by mass or more, and for example, 70 parts by mass or less.

The epoxy equivalent when two types of epoxy resins are used in combination is an epoxy equivalent of all epoxy resins in total calculated by multiplying the epoxy equivalent of each epoxy resin by the mass ratio of each epoxy resin relative to the total amount of the epoxy resin, and adding up these.

The hydroxyl equivalent in the phenol resin per 1 equivalent of the epoxy group of the epoxy resin is, for example, 0.2 equivalent or more, preferably 0.5 equivalent or more, and for example, 2.0 equivalent or less, preferably 1.2 equivalent or less. When the amount of the hydroxyl group is in the above-described range, curing reaction of the soft magnetic thermosetting film 2 is excellent, and deterioration can be suppressed.

The thermosetting resin content of the thermosetting resin component 7 relative to 100 parts by mass of the thermosetting resin component is, for example, 20 parts by mass or more, preferably 30 parts by mass or more, and for example, 90 parts by mass or less, preferably 80 parts by mass or less, more preferably 60 parts by mass or less.

The thermosetting resin component 7 preferably contains acrylic resin in addition to the thermosetting resin. More preferably, acrylic resin, epoxy resin, and phenol resin are used in combination. By allowing the thermosetting resin component 7 to contain these resins, the soft magnetic thermosetting film 2 obtained from the soft magnetic resin composition exhibits excellent adhesiveness and excellent thermosetting properties.

An example of the acrylic resin includes an acrylic-type polymer produced by polymerizing a monomer component of one, or two or more of straight chain or branched alkyl (meth)acrylate ester having an alkyl group. "(Meth)acrylic" represents "acrylic and/or methacrylic".

An example of the alkyl group includes an alkyl group having 1 to 20 carbon atoms such as a methyl group, an ethyl group, a propyl group, an isopropyl group, a n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, an undecyl group, a lauryl group, a tridecyl group, a tetradecyl group, a stearyl group, an octadecyl group, and a dodecyl group. Preferably, an alkyl group having 1 to 6 carbon atoms is used.

The acrylic-type polymer can be a copolymer of the alkyl(meth)acrylate ester and an additional monomer.

Examples of the additional monomer include glycidyl group-containing monomers such as glycidylacrylate and glycidylmethacrylate; carboxyl group-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl group-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate, and (4-hydroxymethylcyclohexyl)-methylacrylate; sulfonic acid group-containing monomers such as styrenesulfonic acid, allylsulfonic acid, 2-(meth) acrylamide-2-methylpropane sulfonic acid, (meth) acrylamidepropane sulfonic acid, sulfopropyl (meth)acrylate, and (meth)acryloyloxynaphthalenesulfonic acid; phosphoric acid group-containing monomers such as 2-hydroxyethylacryloyl phosphate; styrene monomer; and acrylonitrile.

Among these, preferably, a glycidyl group-containing monomer, a carboxyl group-containing monomer, or a hydroxyl group-containing monomer is used. When the acrylic resin is a copolymer of alkyl(meth)acrylate ester and an additional monomer, that is, when the acrylic resin has a glycidyl group, a carboxyl group, or a hydroxyl group, the soft magnetic film obtained from the soft magnetic thermosetting film having excellent reflow resistance can be achieved.

The mixing ratio of the additional monomer (mass) is, when a copolymer of the alkyl (meth)acrylate ester and the additional monomer is used, preferably 40 mass % or less relative to the copolymer.

The acrylic resin has a weight-average molecular weight of, for example, $1\times10^5$ or more, preferably $3\times10^5$ or more, and for example, $1\times10^6$ or less. By setting the mixing ratio of the additional monomer (mass) in this range, the soft magnetic thermosetting film having excellent adhesiveness and excellent reflow resistance can be achieved. The weight-average molecular weight is measured by gel permeation chromatography (GPC) based on a polystyrene standard calibration value.

The acrylic resin has a glass transition temperature (Tg) of, for example, −30° C. or more, preferably −20° C. or more, and for example, 30° C. or less, preferably 15° C. or less. When the glass transition temperature (Tg) is the above-described lower limit or more, the soft magnetic thermosetting film 2 having excellent adhesiveness can be achieved. Meanwhile, when the glass transition temperature (Tg) is the above-described upper limit or less, the soft magnetic thermosetting film 2 having excellent handleability can be achieved. The glass transition temperature is determined based on the maximum value of the loss tangent (tanδ) measured by using a dynamic viscoelasticity measuring apparatus (DMA, frequency of 1 Hz, temperature increase rate of 10° C./min)

The acrylic resin has a specific gravity of, for example, 1.0 or more and for example, 1.3 or less.

When the thermosetting resin component 7 contains the acrylic resin, the acrylic resin content relative to 100 parts by mass of the thermosetting resin component is, for example, 10 parts by mass or more, preferably 20 parts by mass or more, more preferably 40 parts by mass or more, and for example, 80 parts by mass or less, preferably 70 parts by mass or less. By setting the acrylic resin content in the above-described range, the soft magnetic resin composition having excellent film-forming properties and the soft magnetic thermosetting film 2 having excellent adhesiveness can be achieved.

The thermosetting resin component 7 content of the soft magnetic resin composition is, for example, 2 mass % or more, preferably 5 mass % or more, and for example, 50 mass % or less, preferably 20 mass % or less, more preferably 15 mass % or less. By setting the thermosetting resin component 7 content in the above-described range, the soft magnetic resin composition having excellent film-forming properties and the soft magnetic thermosetting film 2 having excellent magnetic properties can be achieved.

The thermosetting resin component 7 can contain an additional resin other than the thermosetting resin and the acrylic resin. Such an additional resin includes, for example, a thermoplastic resin.

Examples of the thermoplastic resin include natural rubber, butyl rubber, isoprene rubber, chloroprene rubber, an ethylene-vinyl acetate copolymer, polybutadiene resin, polycarbonate resin, thermoplastic polyimide resin, polyamide resin (6-nylon, 6,6-nylon, etc.), phenoxy resin, saturated polyester resin (PET, PBT, etc.), polyamide-imide resin, and fluorine resin. These resins can be used singly, or can be used in combination of two or more.

The thermosetting resin component 7 has a specific gravity of, for example, 1.0 or more, preferably 1.1 or more, and for example, 1.5 or less, preferably 1.3 or less.

The additional resin content of the thermosetting resin component 7 is, for example, 10 mass % or less, preferably 5 mass % or less.

The soft magnetic resin composition (and the soft magnetic thermosetting film 2 and a soft magnetic film 10) preferably contains a thermosetting catalyst.

The thermosetting catalyst is not limited as long as the catalyst accelerates curing of the thermosetting resin component 7 by heating, and examples thereof include a salt having an imidazole skeleton, a salt having a triphenylphosphine structure, a salt having a triphenylborane structure, and an amino group-containing compound.

Examples of the salt having an imidazole skeleton include 2-phenylimidazole (trade name; 2PZ), 2-ethyl-4-methylimidazole (trade name; 2E4MZ), 2-methylimidazole (trade name; 2MZ), 2-undecylimidazole (trade name; C11Z), 2-phenyl-4,5-dihydroxymethylimidazole (trade name; 2-PHZ), and 2,4-diamino-6-[2'-methylimidazolyl (1')]-ethyl-s-triazine isocyanuric acid adduct (trade name; 2MAOK-PW) (the above-described products are all manufactured by Shikoku Chemicals Corporation).

Examples of the salt having a triphenylphosphine structure include triorganophosphine such as triphenylphosphine, tributyl phosphine, tri(p-methylphenyl)phosphine, tri(nonylphenyl)phosphine, and diphenyltolyl phosphine; tetraphenylphosphonium bromide (trade name; TPP-PB); methyltriphenylphosphonium (trade name; TPP-MB); methyltriphenylphosphonium chloride (trade name; TPP-MC); methoxymethyltriphenylphosphonium (trade name; TPP-MOC); benzyltriphenylphosphonium chloride (trade name; TPP-ZC); and methyltriphenylphosphonium (trade name; TPP-MB) (the above-described products are all manufactured by HOKKO CHEMICAL INDUSTRY CO., LTD.)

An example of the salt having a triphenylborane structure includes tri(p-methylphenyl) phosphine. The salt having a triphenylborane structure further includes those having a triphenylphosphine structure. Examples of the salt having a triphenylphosphine structure and a triphenylborane structure include tetraphenylphosphonium tetraphenylborate (trade name; TPP-K), tetraphenylphosphonium tetra-p-triborate (trade name; TPP-MK), benzyltriphenylphosphonium tetraphenylborate (trade name; TPP-ZK), and triphenylphosphine triphenylborane (trade name; TPP-S) (the above-described products are all manufactured by HOKKO CHEMICAL INDUSTRY CO., LTD.).

Examples of the amino group-containing compound include monoethanolaminetrifluoroborate (manufactured by STELLACHEMIFA CORPORATION) and dicyandiamide (manufactured by NACALAI TESQUE, INC.).

The thermosetting catalyst has a shape of, for example, spherical or ellipsoidal.

These thermosetting catalysts can be used singly, or can be used in combination of two or more.

The thermosetting catalyst has a specific gravity of, for example, 1.0 or more and for example, 1.5 or less.

The mixing ratio of the thermosetting catalyst relative to 100 parts by mass of the resin component is, for example, 0.2 parts by mass or more, preferably 0.3 parts by mass or more, and for example, 5 parts by mass or less, preferably 2 parts by mass or less. When the mixing ratio of the thermosetting catalyst is the above-described upper limit or less, storage stability for a long period of time at room temperature of the soft magnetic thermosetting film 2 can be made excellent. Meanwhile, when the mixing ratio of the thermosetting catalyst is the above-described lower limit or more, the soft magnetic thermosetting film 2 can be cured by heating at low temperature and for a short period of time, and reflow resistance of the soft magnetic film 10 obtained from the soft magnetic thermosetting film 2 can be made excellent.

The soft magnetic resin composition preferably contains polyether phosphate ester. In this manner, even when the soft magnetic resin composition contains the soft magnetic particles at a higher proportion, it can be surely formed into the soft magnetic thermosetting film 2 (film shape). Also, magnetic properties of the soft magnetic thermosetting film 2 can be improved.

Examples of the polyether phosphate ester include polyoxyalkylene alkyl ether phosphate and polyoxyalkylene alkyl phenyl ether phosphate. Preferably, polyoxyalkylene alkyl ether phosphate is used.

These polyether phosphate esters can be used singly, or can be used in combination of two or more. The polyether phosphate ester may be a mixture with amine or the like.

To be specific, examples of the polyether phosphate ester include the HIPLAAD series manufactured by Kusumoto Chemicals, Ltd. ("ED152", "ED153", "ED154", "ED118", "ED174", and "ED251").

The polyether phosphate ester has an acid value of, for example, 10 or more, preferably 15 or more, and for example, 200 or less, preferably 150 or less. The acid value is measured by a neutralization titration method or the like.

The polyether phosphate ester has a specific gravity of, for example, 1.0 or more and for example, 1.3 or less.

The polyether phosphate ester content relative to 100 parts by mass of the soft magnetic particles is, for example, 0.1 parts by mass or more, preferably 0.5 parts by mass or more, and for example, 5 parts by mass or less, preferably 2 parts by mass or less.

The soft magnetic resin composition may further contain an additional additive as necessary. Examples of the additive include commercially available or known additives such as a cross-linking agent and an inorganic filler.

Examples of the cross-linking agent include polyisocyanate compounds such as tolylene diisocyanate, diphenylmethane diisocyanate, p-phenylenediisocyanate, 1,5-naphthalenediisocyanate, and an adduct of polyhydric alcohol and diisocyanate.

The cross-linking agent content relative to 100 parts by mass of the thermosetting resin component is, for example, 7 parts by mass or less and more than 0 part by mass.

Furthermore, an inorganic filler can be suitably blended in the soft magnetic resin composition in accordance with its use. Thermal conductivity and modulus of elasticity of the soft magnetic film 10 can be improved in this manner.

Examples of the inorganic filler include ceramics such as silica, clay, gypsum, calcium carbonate, barium sulfate, alumina oxide, beryllium oxide, silicon carbide, and silicon nitride; metals or alloys of aluminum, copper, silver, gold, nickel, chromium, lead, tin, zinc, palladium, and solder; and also carbon. These inorganic fillers can be used singly, or can be used in combination of two or more.

The inorganic filler has an average particle size of, for example, 0.1 μm or more and 80 μm or less.

When the inorganic filler is blended, its mixing ratio relative to 100 parts by mass of the thermosetting resin component is, for example, 80 parts by mass or less, preferably 70 parts by mass or less, and for example, more than 0 part by mass.

Next, description is given below of a method for producing the soft magnetic thermosetting film 2 of the present invention.

To produce the soft magnetic thermosetting film 2, first, a soft magnetic resin composition is obtained by mixing the above-described components and next, the soft magnetic resin composition is dissolved or dispersed in a solvent, so that a soft magnetic resin composition solution is prepared.

Examples of the solvent include organic solvents such as ketones including acetone and methyl ethyl ketone (MEK); esters such as ethyl acetate; amides such as N,N-dimethylformamide; and ethers such as propylene glycol monomethyl ether. Examples of the solvent also include water-based solvents such as water and alcohols such as methanol, ethanol, propanol, and isopropanol.

The soft magnetic resin composition solution has a solid content of, for example, 10 mass % or more, preferably 30 mass % or more, more preferably 40 mass % or more, and for example, 90 mass % or less, preferably 70 mass % or less, more preferably 50 mass % or less.

Then, the soft magnetic resin composition solution is applied to a surface of a substrate (separator, core material, etc.) to give a predetermined thickness to form a coating, and then, the coating is dried under predetermined conditions. A soft magnetic thermosetting film is produced in this manner.

The application method is not particularly limited and, for example, doctor blades, roll coating, screen coating, and gravure coating can be used.

Examples of drying conditions include a drying temperature of, for example, 70° C. or more and 160° C. or less, and a drying time of, for example, 1 minute or more and 5 minutes or less.

The soft magnetic thermosetting film 2 has an average film thickness of, for example, 5 μm or more, preferably 50 μm or more, and for example, 1000 μm or less, preferably 500 μm or less, more preferably 300 μm or less.

In the obtained soft magnetic thermosetting film 2, the soft magnetic particles 6 content relative to the soft magnetic thermosetting film 2 is, for example, 50% by volume or more, preferably 60% by volume or more, and for example, 95% by volume or less, preferably 90% by volume or less. In this manner, the soft magnetic thermosetting film 2 having excellent magnetic properties can be achieved.

The soft magnetic thermosetting film 2 is in a semi-cured state (B-stage state) at room temperature (to be specific, at 25° C.). The semi-cured state (B-stage state) is a state between an uncured state (A-stage state) in which the soft magnetic thermosetting film 2 (or the soft magnetic resin composition) is soluble in a solvent and a cured state (C-stage state) in which it is completely cured. The semi-cured state (B-stage state) is also a state in which curing and gelation slightly progress and the soft magnetic thermosetting film 2 is swollen but is not completely dissolved in the solvent, and is softened but is not melted by heating.

The soft magnetic thermosetting film 2 (in a semi-cured state) has a specific gravity of, for example, 2.0 or more, preferably 2.5 or more, and for example, 3.5 or less, preferably 3.0 or less. The weight (g) of the film in the air and the weight (g) thereof in water are measured using an electronic analytical balance (manufactured by Shimadzu Corporation, "AEL-200") by hydrometry, so that the specific gravity of the film is calculated by the following formula.

Specific Gravity (S. G.)=$W1/(W1-W2)$

In formula, W1 represents the weight (g) of the film in the air and W2 represents the weight (g) of the film in water.

The soft magnetic thermosetting film 2 has a porosity of 15% or more, preferably 20% or more, more preferably 30% or more, and for example, 60% or less, preferably 50% or less, more preferably 40% or less. When the porosity is below the above-described lower limit, adhesiveness and reflow resistance are not sufficient. Meanwhile, when the porosity is more than the above-described upper limit, in a case where the soft magnetic thermosetting film is cured by heating by vacuum hot pressing, time for discharging the air at the inside of the void to the outside is long, so that the yield is poor.

The porosity is measured by the following formula.

Porosity (%)={1−(specific gravity (S.G.))/(theoretical specific gravity)}×100

The theoretical specific gravity is obtained by multiplying the specific gravity of each of the solid components by the mixing ratio (weight) of each of the solid components and adding up these as to each of the solid components (the soft magnetic particles 6 and the thermosetting resin component; and the thermosetting catalyst, the polyether phosphate ester, and an additional additive added as necessary) contained in the soft magnetic resin composition that forms the soft magnetic thermosetting film. The specific gravity of each of the solid components (e.g., the soft magnetic particles) can be referred to a catalogue value or the like.

Of each of the solid components of the soft magnetic resin composition, when the soft magnetic particles 6 and the thermosetting resin component make up the main component, the theoretical specific gravity of the soft magnetic thermosetting film 2 composed of only the soft magnetic particles 6 and the thermosetting resin component can be also replaced with the theoretical specific gravity of the soft magnetic thermosetting film 2.

The soft magnetic thermosetting film 2 (in a semi-cured state) has a theoretical specific gravity of, for example, 2.0 or more, preferably 2.2 or more, and for example, 8.0 or less, preferably 6.0 or less.

The soft magnetic thermosetting film 2 has an average thickness of, for example, 5 μm or more, preferably 50 μm or more, and for example, 500 μm or less, preferably 250 μm or less.

Examples of the separator 1 include a polyethylene terephthalate (PET) film, a polyethylene film, a polypropylene film, and paper. The surfaces of these examples of the separator 1 are subjected to release treatment with, for example, a fluorine release agent, a long-chain alkylacrylate release agent, and a silicone release agent.

Examples of the core material include a plastic film (e.g., polyimide film, polyester film, polyethylene terephthalate film, polyethylene naphthalate film, polycarbonate film, etc.); a metal film (e.g., aluminum foil etc.); and a resin substrate, a silicon substrate, and a glass substrate reinforced with, for example, glass fiber and plastic nonwoven fiber.

The separator 1 or the core material has an average thickness of, for example, 1 μm or more and 500 μm or less.

A preferred embodiment of the soft magnetic thermosetting film 2 is a multi-layer structure in which the separator 1 is laminated on one side of the soft magnetic thermosetting film 2. In this manner, the soft magnetic thermosetting film 2 can be used as a support substrate at the time of transferring the soft magnetic thermosetting film 2 to the circuit board 5.

The circuit board 5 is, for example, a circuit board 5 used with electromagnetic induction method, and on one side and the other side (both sides) of the substrate 4, the wire patterns 3 such as loop coils are formed. The wire pattern 3 is formed by, for example, a semi-additive method or a subtractive method.

Examples of the insulating material that forms the substrate 4 include a glass epoxy substrate, a glass substrate, a PET substrate, a Teflon substrate, a ceramics substrate, and a polyimide substrate.

The substrate 4 preferably has flexibility, that is, is a flexible substrate.

The substrate 4 has a thickness of, for example, 10 μm or more, preferably 50 μm or more, and for example, 500 μm or less, preferably 200 μm or less.

The wire pattern 3 is, for example, formed of a conductor such as copper.

A wire 8 that forms the wire pattern 3 has a width of, for example, 5 μm or more, preferably 9 μm or more, and for example, 500 μm or less, preferably 300 μm or less.

The wire 8 has a thickness (height, length of Y shown in FIG. 1A) of, for example, 5 μm or more, preferably 10 μm or more, and for example, 50 μm or less, preferably 35 μm or less.

Gaps 9 (pitches, length of X shown in FIG. 1A) between the wires 8 are, for example, 50 μm or more, preferably 80 μm or more, and for example, 3 mm or less, preferably 2 mm or less.

The circuit board 5 has a thickness of, for example, 50 μm or more, preferably 100 μm or more, and for example, 1000 μm or less, preferably 500 μm or less.

Figure 1B:
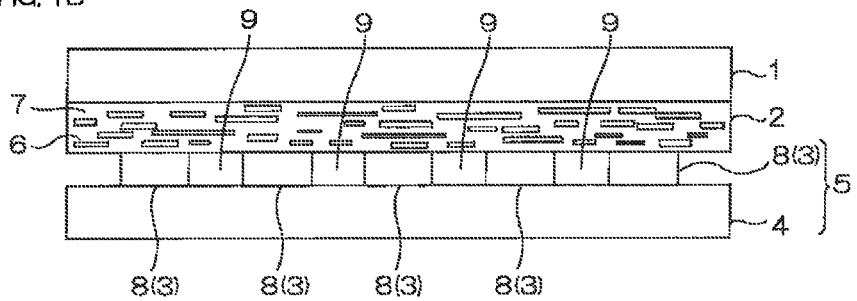
FIG. 1B shows a process drawing for illustrating one embodiment of a method for producing a soft magnetic film laminate circuit board of the present invention, illustrating, subsequent to FIG. 1A, a step of bringing the soft magnetic thermosetting film into contact with the circuit board.

Then, as shown in FIG. 1B, the soft magnetic thermosetting film 2 is brought into contact with (laminated on) one side of the circuit board 5. That is, the lower surface (the other side) of the soft magnetic thermosetting film 2 is brought into contact with the upper surfaces of the wires 8 formed on the circuit board 5.

Figure 1C:
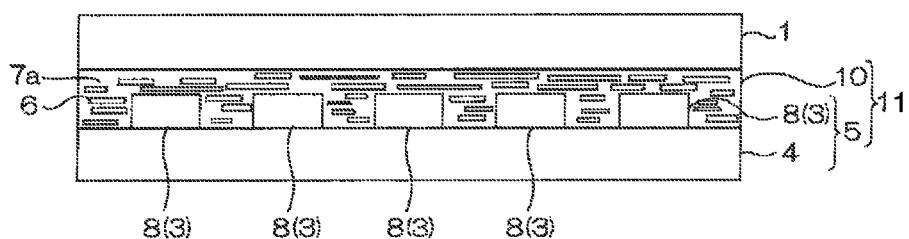
FIG. 1C shows a process drawing for illustrating one embodiment of a method for producing a soft magnetic film laminate circuit board of the present invention, illustrating, subsequent to FIG. 1B, a step of curing the soft magnetic thermosetting film by heating.

Thereafter, as shown in FIG. 1C, the soft magnetic thermosetting film 2 is subjected to vacuum hot pressing. To be specific, the soft magnetic thermosetting film 2 is pressed toward the circuit board 5, while being heated, under the environment of vacuum (low pressure).

In this manner, the soft magnetic resin composition that forms the soft magnetic thermosetting film 2 flows, and the wire patterns 3 are embedded in the soft magnetic resin composition. That is, the front surfaces and the side surfaces of the wires 8 that form the wire patterns 3 are covered with the soft magnetic resin composition. Together with the coverage of the front surfaces and the side surfaces of the wires 8, the front surface of the substrate 4 exposed from the wire patterns 3 is covered with the soft magnetic resin composition. The thermosetting resin component 7 cures by heating to be brought into a cured resin component 7a to be then brought into the soft magnetic film 10 (in a cured state). In this manner, the soft magnetic film laminate circuit board 11 in which the soft magnetic film 10 is laminated on the circuit board 5 is produced (ref: FIG. 1C).

The pressure is, for example, 10 kN/cm$^2$ or more, preferably 100 kN/cm$^2$ or more, and for example, 1000 kN/cm$^2$ or less, preferably 500 kN/cm$^2$ or less.

The heating temperature is, for example, 80° C. or more, preferably 100° C. or more, and for example, 200° C. or less, preferably 175° C. or less.

The degree of vacuum is, for example, 2000 Pa or less, preferably 1000 Pa or less, more preferably 100 Pa or less.

The time required for the vacuum hot pressing is, for example, 0.1 hours or more, preferably 0.2 hours or more, and for example, 24 hours or less, preferably 3 hours or less, more preferably 2 hours or less.

As shown in FIG. 1C, the soft magnetic film laminate circuit board 11 thus produced includes the circuit board 5 formed with the wire patterns 3 and the soft magnetic film 10 laminated on the one side of the circuit board 5.

The soft magnetic film 10 is a film that is formed by curing the soft magnetic thermosetting film 2 by heating. That is, the soft magnetic film 10 is the soft magnetic thermosetting film 2 in a cured state (C-stage state). The soft magnetic film 10 is formed of the soft magnetic particles 6, the cured resin component 7a formed by curing the thermosetting resin component 7 by heating, and components added as necessary (the thermosetting catalyst, the polyether phosphate ester, an additional additive, etc.).

In the soft magnetic film laminate circuit board 11, the wire patterns 3 are embedded in the soft magnetic film 10. That is, the front surfaces and the side surfaces of the wires 8 that form the wire patterns 3 are covered with the soft magnetic film 10. Together with the coverage of the front surfaces and the side surfaces of the wires 8, the front surface of the substrate 4 exposed from the wire patterns 3 is covered with the soft magnetic film 10.

Between the separator 1 and the wires 8 or the substrate 4, and in the gaps 9 between the wires 8, the soft magnetic particles 6 and the cured resin component 7a are present, and when the soft magnetic particles 6 are shaped flat, the soft magnetic particles 6 are oriented such that their longitudinal direction (direction perpendicular to the thickness direction) is along a surface direction of the soft magnetic film 10.

The soft magnetic film 10 (that is, the soft magnetic thermosetting film 2 in the cured state) has a specific gravity of, for example, 3.5 or more, preferably 4.0 or more, and 6.5 or less.

The specific gravity (specific gravity ratio) of the soft magnetic film 10 relative to that of the soft magnetic thermosetting film 2 in the semi-cured state is, for example, 1.5 times or more, preferably 1.8 times or more, and for example, 3.3 times or less. By setting such specific gravity ratio, occurrence of a void on the interface between the soft magnetic film 10 and the circuit board 5 in the soft magnetic film laminate circuit board 11 can be further reduced, and reflow resistance of the soft magnetic film laminate circuit board 11 can be improved.

In the embodiments of FIGS. 1A to 1C, in the circuit board 5, the wire patterns 3 are formed on the one side and the other side of the substrate 4. Alternatively, the wire pattern 3 can be also formed on only the one side or the other side of the substrate 4.

In the embodiments of FIGS. 1A to 1C, only one (one layer) of the soft magnetic thermosetting film 2 is bonded onto the circuit board. However, the soft magnetic thermosetting film 2 can be also bonded in a plural number (a plurality of layers) to produce the soft magnetic film 10 having a desired thickness. In such a case, for example, 2 to 20 layers are bonded, or preferably 2 to 5 layers are bonded.

In the embodiments of FIGS. 1A to 1C, a layer such as a cover layer is not laminated on the other side of the circuit board 5. Alternatively, for example, a cover layer formed of polyimide or the like can be also provided on the other side of the circuit board 5. When the cover layer is provided, an adhesive layer containing epoxy resin, phenol resin, and the like can be also laminated between the cover layer and the circuit board 5 as necessary.

The soft magnetic film laminate circuit board 11 can be, for example, used as a position detection device.

The position detection device includes, for example, a sensor board having the soft magnetic film laminate circuit board 11 and a sensor portion mounted on the soft magnetic film laminate circuit board 11, and a position detection flat plate disposed above and to face the sensor board.

Examples of the reflowing process at the time of mounting the sensor portion on the soft magnetic film laminate circuit board 11 include, for example, hot air reflowing and infrared reflowing. The heating can be either entirely or partially.

The heating temperature in the reflowing step is, for example, 200° C. or more, preferably 240° C. or more, and for example, 300° C. or less, preferably 265° C. or less. The heating time is, for example, 1 second or more, preferably 5 seconds or more, more preferably 30 seconds or more, and for example, 2 minutes or less, preferably 1.5 minutes or less.

The position detection device is produced by disposing the position detection flat plate to face the above-described sensor board in spaced-apart relation.

The method for producing the soft magnetic film laminate circuit board 11 includes the steps of bringing the soft magnetic thermosetting film 2 containing the soft magnetic particles 6, having a porosity of 15% or more and 60% or less, and in a semi-cured state into contact with the one side of the circuit board 5 and bringing the soft magnetic thermosetting film 2 into a cured state by vacuum hot pressing.

Thus, the soft magnetic film 10 can surely adhere (and be fixed) to the circuit board 5, and therefore, the soft magnetic film laminate circuit board 11 having excellent adhesiveness of the soft magnetic film 10 to the circuit board 5 can be produced.

Also, the soft magnetic thermosetting film 2 has a specific porosity and hot pressing is performed under vacuum, so that the air in the gap on the interface between the soft magnetic thermosetting film 2 and the circuit board 5 can be efficiently absorbed, while the soft magnetic thermosetting film 2 is cured, through a void of the soft magnetic thermosetting film 2. Thus, the void at the inside of the soft magnetic film 10 is reduced, while occurrence of the void on the interface between the produced soft magnetic film laminate circuit board 11 and the soft magnetic film 10 is reduced, thereby high density of the soft magnetic film can be achieved. As a result, in the reflowing step in which an electronic component such as a sensor portion is mounted on the soft magnetic film laminate circuit board 11 to be subjected to treatment at higher temperature, occurrence of unevenness on the surface of the soft magnetic film laminate circuit board 11 and peeling of the soft magnetic film 10 caused by expansion of the void can be suppressed. Accordingly, the soft magnetic film laminate circuit board 11 having excellent reflow resistance can be produced.

Also, an adhesive layer is not required, so that thinning of the soft magnetic film laminate circuit board 11 can be achieved. Furthermore, a process of providing the adhesive layer is not required, so that the soft magnetic film laminate circuit board 11 can be easily produced.

Moreover, the soft magnetic film 10 can be disposed on (near) the surface of the circuit board 5, so that the soft magnetic film laminate circuit board 11 having excellent magnetic properties can be produced.

EXAMPLES

While in the following, the present invention is described in further detail with reference to Examples and Comparative Examples, the present invention is not limited to any of them by no means. The numeral values in Examples shown below can be replaced with the numeral values shown in the above-described embodiments (that is, the upper limit value or the lower limit value).

Example 1

(Preparation of Circuit Board)

A double-sided wire pattern forming circuit board (total thickness of 48 μm, width of wire of 100 μm, gap (pitch) between wires of 500 μm) in which a loop coil wire pattern having a thickness of 15 μm was formed on both sides of a board having flexibility (polyimide film, thickness of 18 μm) was prepared.

(Preparation of Soft Magnetic Thermosetting Film)

A soft magnetic thermosetting film was prepared as follows.

A soft magnetic resin composition was produced by mixing 500 parts by mass of soft magnetic particles, 25 parts by mass of an acrylate ester polymer, 13 parts by mass of bisphenol A epoxy resin (1), 7 parts by mass of bisphenol A epoxy resin (2), 9 parts by mass of phenol aralkyl resin, 0.27 parts by mass (0.5 parts by mass relative to 100 parts by mass of thermosetting resin component) of thermosetting catalyst, and 2.5 parts by mass (0.5 parts by mass relative to 100 parts by mass of the soft magnetic particles) of polyether phosphate ester so that the soft magnetic particles were 50% by volume.

The soft magnetic resin composition was dissolved in methyl ethyl ketone, thereby producing a soft magnetic resin composition solution having a solid content concentration of 43 mass %.

The soft magnetic resin composition solution was applied on a separator (average thickness of 50 μm) composed of a polyethylene terephthalate film subjected to silicone release treatment, and thereafter, dried at 130° C. for 2 minutes.

In this manner, a soft magnetic thermosetting film (average thickness of only the soft magnetic thermosetting film 2 of 200 μm) on which the separator was laminated was produced. The soft magnetic thermosetting film was in a semi-cured state.

When the porosity of the soft magnetic thermosetting film was measured (described later), the obtained value was 32%. Also, when the specific gravity thereof was measured (described later), the obtained value was 2.7.

(Production of Soft Magnetic Film Laminate Circuit Board)

The prepared soft magnetic thermosetting film on which the separator was laminated was laminated so that the surface of the soft magnetic thermosetting film was in contact with one side (wire pattern surface) of the circuit board to be next disposed in a vacuum hot pressing device (manufactured by Mikado Technos Co., Ltd.).

Next, hot pressing was performed under the conditions of a vacuum of 1000 Pa, a temperature of 175° C., and a pressure of 400 kN/cm² for 30 minutes, so that the soft magnetic thermosetting film was thermally cured. In this manner, a soft magnetic film laminate circuit board was produced.

When the specific gravity of the soft magnetic film (the soft magnetic thermosetting film in a cured state) at this time was measured, the obtained value was 4.0.

Examples 2 and 3

(Preparation of Circuit Board and Soft Magnetic Thermosetting Film)

Soft magnetic film laminate circuit boards of Examples were produced in the same manner as in Example 1, except that the mixing proportion of the soft magnetic particles was adjusted so that the soft magnetic particles had the mixing proportion (filling amount) described in Table 1. In each Example, the same circuit board as that in Example 1 was prepared.

(Production of Soft Magnetic Film Laminate Circuit Board)

Soft magnetic film laminate circuit boards were produced in the same manner as in Example 1, except that the soft magnetic thermosetting films were used.

The porosity and the specific gravity of the films are shown in Table 1.

Example 4

(Preparation of Circuit Board and Soft Magnetic Thermosetting Film)

A soft magnetic film laminate circuit board of Example was produced in the same manner as in Example 1, except that the mixing proportion of the soft magnetic particles was adjusted so that the soft magnetic particles had the mixing proportion (filling amount) described in Table 1. The same circuit board as that in Example 1 was prepared. The soft magnetic thermosetting film only before being laminated on the circuit board was disposed in a vacuum hot pressing device to be subjected to hot pressing (pretreatment hot pressing) under the conditions of under vacuum of 1000 Pa, a temperature of 175° C., and a pressure of 400 kN/cm² for 30 seconds.

(Production of Soft Magnetic Film Laminate Circuit Board)

A soft magnetic film laminate circuit board was produced in the same manner as in Example 1, except that the soft magnetic thermosetting film that was subjected to pretreatment hot pressing was used.

The porosity and the specific gravity of the film are shown in Table 1.

Comparative Example 1

(Preparation of Circuit Board and Soft Magnetic Thermosetting Film)

A soft magnetic thermosetting film and a circuit board were prepared in the same manner as in Example 1. The soft magnetic thermosetting film only before being laminated on the circuit board was disposed in a vacuum hot pressing device to be subjected to hot pressing (pretreatment hot pressing) under the conditions of under vacuum of 1000 Pa, a temperature of 175° C., and a pressure of 400 kN/cm² for 2 minutes.

The soft magnetic thermosetting film that was subjected to pretreatment hot pressing had a porosity of 13% and a specific gravity of 3.5.

(Production of Soft Magnetic Film Laminate Circuit Board)

A soft magnetic film laminate circuit board was produced in the same manner as in Example 1, except that the soft magnetic thermosetting film that was subjected to pretreatment hot pressing was used.

When the specific gravity of the soft magnetic film (the soft magnetic thermosetting film in a cured state) at this time was measured, the obtained value was 3.7.

Comparative Example 2

(Preparation of Circuit Board and Soft Magnetic Thermosetting Film)

A soft magnetic thermosetting film and a circuit board were prepared in the same manner as in Example 2. The soft magnetic thermosetting film only before being brought into contact with the circuit board was disposed in a vacuum hot pressing device to be subjected to hot pressing (pretreatment hot pressing) under the conditions of under vacuum of 1000 Pa, a temperature of 175° C., and a pressure of 400 kN/cm² for 2 minutes.

The soft magnetic thermosetting film that was subjected to pretreatment hot pressing had a porosity of 11% and a specific gravity of 4.0.

(Production of Soft Magnetic Film Laminate Circuit Board)

A soft magnetic film laminate circuit board was produced in the same manner as in Example 1, except that the soft magnetic thermosetting film that was subjected to pretreatment hot pressing was used.

When the specific gravity of the soft magnetic film (the soft magnetic thermosetting film in a cured state) at this time was measured, the obtained value was 4.5.

<Measurement of Specific Gravity>

In a state where the soft magnetic thermosetting films (in a semi-cured state) of Examples and Comparative Examples were peeled from the respective separators and where the soft magnetic films (in a cured state) of Examples and Comparative Examples were peeled from the respective circuit boards, measurement was performed as follows.

The weight (g) of the film in the air and the weight (g) thereof in water were measured using an electronic analytical balance (manufactured by Shimadzu Corporation, "AEL-200") by hydrometry, so that the specific gravity of the film was calculated by the following formula.

$$\text{Specific Gravity (S. G.)} = W1/(W1 - W2)$$

In formula, W1 represents the weight (g) of the film in the air and W2 represents the weight (g) of the film in water.

<Measurement of Porosity>

The porosity was measured by the following formula.

$$\text{Porosity (\%)} = \{1 - (\text{specific gravity (S.G.)})/(\text{theoretical specific gravity})\} \times 100$$

(Evaluation)

Adhesiveness

In the soft magnetic film laminate circuit boards of Examples and Comparative Examples, the soft magnetic films only were attempted to be peeled from the respective circuit boards.

Those with the soft magnetic films only completely peeled from the circuit boards without occurrence of cohesive failure of the soft magnetic films were evaluated as Bad; those with the soft magnetic films peeled from the circuit boards but only a part of the soft magnetic films attached to the circuit boards were evaluated as Good; and those with cohesive failure of the soft magnetic films occurring during peeling and a part of the soft magnetic films remained to be attached to the circuit boards were evaluated as Excellent.

The results are shown in Table 1.

Reflow Resistance

The soft magnetic film laminate circuit boards of Examples and Comparative Examples were allowed to pass through an IR reflow oven with its temperature set so that it kept a temperature of 260° C. or more for 10 seconds, thereby producing reflow treated substrates.

In the reflow treated substrates, those with occurrence of unevenness or floating at the surfaces of the soft magnetic films were evaluated as Bad, those with slight occurrence of unevenness at the surfaces of the soft magnetic films were evaluated as Good, and those with no occurrence of unevenness at the surfaces of the soft magnetic films were evaluated as Excellent.

The results are shown in Table 1.

Magnetic Properties

The magnetic permeability of the soft magnetic films of the soft magnetic film laminate circuit boards obtained in Examples and Comparative Examples was measured by a one turn method using an impedance analyzer (manufactured by Agilent Technologies, product number "4294A").

Those with a magnetic permeability $\mu'$ at a frequency of 1 MHz of 100 or more were evaluated as Excellent and those with the magnetic permeability $\mu'$ at a frequency of 1 MHz of less than 100 were evaluated as Bad.

The results are shown in Table 1.

Bisphenol A epoxy resin (2): trade name "Epikote YL980", epoxy equivalent of 180 to 190 g/eq, manufactured by JER, specific gravity of 1.15

Phenolaralkyl resin: trade name "MILEX XLC-4L", hydroxyl equivalent of 170 g/eq, manufactured by Mitsui Chemicals, Inc., specific gravity of 1.18

Polyether phosphate ester: trade name "HIPLAAD ED 152", polyether phosphate ester, manufactured by Kusumoto Chemicals, Ltd., acid value of 17, specific gravity of 1.03

Thermosetting catalyst: trade name "TPP-SCN", tetraphenylphosphonium thiocyanate, manufactured by HOKKO CHEMICAL INDUSTRY CO., LTD., specific gravity of about 1.2

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

The soft magnetic film laminate circuit board obtained by the producing method of the present invention can be applied in various industrial products. To be specific, the soft magnetic film laminate circuit board obtained by the producing method of the present invention can be used for a position detection device or the like.

TABLE 1

|  | Ex. 1 | Ex. 2 | Ex. 3 | Ex. 4 | Comp. Ex. 1 | Comp. Ex. 2 |
| --- | --- | --- | --- | --- | --- | --- |
| Soft Magnetic Particles Content (% by volume) | 50 | 60 | 70 | 50 | 50 | 60 |
| Porosity of Soft Magnetic Thermosetting Film | 32 | 45 | 53 | 23 | 13 | 11 |
| Theoretical Specific Gravity | 4.0 | 4.5 | 5.1 | 4.0 | 4.0 | 4.5 |
| Specific Gravity of Soft Magnetic Thermosetting Film (Semi-Cured State) | 2.7 | 2.5 | 2.4 | 3.1 | 3.5 | 4.0 |
| Specific Gravity of Soft Magnetic Film (Cured State) | 4.0 | 4.5 | 4.8 | 4.0 | 3.7 | 4.5 |
| Specific Gravity Ratio (Cured State/Semi-Cured State) | 1.5 | 1.8 | 2.0 | 1.3 | 1.1 | 1.1 |
| Adhesiveness | Excellent | Good | Good | Good | Bad | Bad |
| Reflow Resistance | Excellent | Excellent | Excellent | Good | Bad | Bad |
| Magnetic Properties | Excellent | Excellent | Excellent | Excellent | Excellent | Excellent |

Materials below are used as components in Examples and Comparative Examples.

Fe—Si—Al alloy: trade name "SP-7", soft magnetic particles, average particle size of 65 μm, flat, manufactured by Mate Co., Ltd., specific gravity of 6.8

Acrylate ester polymer: trade name "Paracron W-197CM", acrylate ester polymer mainly composed of ethyl acrylate-methyl methacrylate, manufactured by Negami Chemical Industrial Co., Ltd., specific gravity of about 1.0

Bisphenol A epoxy resin (1): trade name "Epikote 1004", epoxy equivalent of 875 to 975 g/eq, manufactured by JER, specific gravity of 1.21

DESCRIPTION OF REFERENCE NUMERALS

2 Soft magnetic thermosetting film
5 Circuit board
6 Soft magnetic particles
7 Resin component
10 Soft magnetic film
11 Soft magnetic film laminate circuit board

The invention claimed is:

1. A method for producing a soft magnetic film laminate circuit board having a soft magnetic film laminated on at least one side of a circuit board comprising the steps of:
   bringing a soft magnetic thermosetting film into contact with the one side of the circuit board, wherein the soft magnetic thermosetting film contains soft magnetic particles, has a porosity of 15% or more and 60% or less, and is in a semi-cured state; and bringing the soft magnetic thermosetting film into a cured state by vacuum hot pressing.

2. The method for producing a soft magnetic film laminate circuit board according to claim 1, wherein the specific gravity of the soft magnetic thermosetting film in a cured state relative to that of the soft magnetic thermosetting film in a semi-cured state is 1.5 times or more.

\* \* \* \* \*